(12) United States Patent
Norman

(10) Patent No.: US 7,990,762 B2
(45) Date of Patent: Aug. 2, 2011

(54) INTEGRATED CIRCUITS TO CONTROL ACCESS TO MULTIPLE LAYERS OF MEMORY

(75) Inventor: Robert Norman, Pendleton, OR (US)

(73) Assignee: Unity Semiconductor Corporation

( * ) Notice: Subject to any disclaimer, the term of this patent is extended or adjusted under 35 U.S.C. 154(b) by 26 days.

(21) Appl. No.: 12/012,945

(22) Filed: Feb. 6, 2008

(65) Prior Publication Data

US 2009/0196083 A1    Aug. 6, 2009

(51) Int. Cl.
*G11C 11/34* (2006.01)

(52) U.S. Cl. ............... 365/185.01; 365/63; 365/148; 365/158; 365/230.03

(58) Field of Classification Search ........... 365/51, 365/230.01, 63, 193, 230.03; 703/24, 23; 711/163, 156, 152, 145
See application file for complete search history.

(56) References Cited

U.S. PATENT DOCUMENTS

| | | | |
|---|---|---|---|
| 4,519,032 A * | 5/1985 | Mendell ................. | 711/173 |
| 6,034,882 A | 3/2000 | Johnson et al. | |
| 7,106,639 B2 * | 9/2006 | Taussig et al. .......... | 365/200 |
| 7,327,600 B2 | 2/2008 | Norman | |
| 7,460,385 B2 | 12/2008 | Gruber et al. | |
| 2003/0151959 A1 | 8/2003 | Tringali et al. | |
| 2004/0138868 A1* | 7/2004 | Kuznetsov et al. ........ | 703/25 |
| 2006/0164882 A1* | 7/2006 | Norman .................. | 365/158 |
| 2006/0171200 A1* | 8/2006 | Rinerson et al. ......... | 365/185.1 |
| 2008/0005459 A1 | 1/2008 | Norman | |
| 2008/0084727 A1 | 4/2008 | Norman | |

OTHER PUBLICATIONS

U.S. Appl. No. 12/004,740, filed Dec. 23, 2007, Robert Norman.
U.S. Appl. No. 12/004,768, filed Dec. 22, 2007, Robert Norman.
U.S. Appl. No. 11/975,275, filed Oct. 17, 2007, Robert Norman.
U.S. Appl. No. 11/893,647, filed Aug. 16, 2007, Robert Norman.
U.S. Appl. No. 11/843,644, filed Aug. 16, 2007, Robert Norman.
U.S. Appl. No. 12/004,192, filed Dec. 20, 2007, Robert Norman.
U.S. Appl. No. 12/004,292, filed Dec. 19, 2007, Robert Norman.
U.S. Appl. No. 12/005,685, filed Dec. 28, 2007, Robert Norman.
U.S. Appl. No. 12/004,734, filed Dec. 24, 2007, Robert Norman.
U.S. Appl. No. 12/006,006, filed Dec. 29, 2007, Robert Norman.
U.S. Appl. No. 12/008,077, filed Jan. 7, 2008, Robert Norman.
U.S. Appl. No. 12/006,970, filed Jan. 8, 2008, Robert Norman.
U.S. Appl. No. 12/008,212, filed Jan. 9, 2008, Robert Norman.
U.S. Appl. No. 12/008,345, filed Jan. 10, 2008, Robert Norman.
U.S. Appl. No. 12/012,641, filed Feb. 5, 2008, Robert Norman.

* cited by examiner

*Primary Examiner* — Pho M Luu
*Assistant Examiner* — Tha-O Bui

(57) ABSTRACT

Circuits to control access to memory; for example, third dimension memory are provided. An integrated circuit (IC) may be configured to control access to memory cells. For example, the IC may include a memory having memory cells that are vertically disposed in multiple layers of memory. The IC may include a memory access circuit configured to control access to a first subset of the memory cells in response to access control data in a second subset of the memory cells. Each memory cell may include a non-volatile two-terminal memory element that stores data as a plurality of conductivity profiles that can be non-destructively sensed by applying a read voltage across the two terminals of the memory element. New data can be written by applying a write voltage across the two terminals of the memory element. The two-terminal memory elements can be arranged in a two-terminal cross-point array configuration.

25 Claims, 10 Drawing Sheets

INTEGRATED CIRCUITS TO CONTROL ACCESS TO MULTIPLE LAYERS OF MEMORY

CROSS-REFERENCE TO RELATED APPLICATIONS

This application incorporates by reference the following related application: U.S. patent application Ser. No. 11/095,026, filed Mar. 30, 2005, U.S. Published Application No. 2006/0171200 A1, and titled "Memory Using Mixed Valence Conductive Oxides."

FIELD OF THE INVENTION

Embodiments of the invention relate generally to data storage and computer memory, and more particularly, to systems, integrated circuits and methods for controlling access to multiple layers of memory that implement, for example, third dimension memory technology.

BACKGROUND OF THE INVENTION

Solid state memory devices, or solid-state "disks," are replacing some magnetic hard drives as a storage medium, especially in mass storage applications. Solid state memory devices typically share the same features as magnetic hard drives, such as write protection features. Write protection techniques are used to ensure integrity of data files so they remain uncorrupted. Hard disk drives usually provide switching mechanisms to disable writing to, for example, prevent hackers from corrupting executable instructions or data files.

Nonvolatile solid state memory technologies, such as Flash memory and EEPROM technologies, are commonly used as solid state memory for data storage and computer memory. Solid state storage devices that use these memories also implement structures to protect against unauthorized writing to code files and mass storage data files. Conventionally, Flash memory-based and EEPROM-based storage devices include write protect structures to prevent writing to main memory.

While traditional write protection approaches are functional, they have their drawbacks. First, Flash memory-based storage devices usually use nonvolatile register structures to store data configured to prevent writing to memory. These structures typically increase the size of die as the granularity of write protection decreases. That is, the fewer memory cells that a bit of a nonvolatile register structure protects, such as in a byte of data, the more nonvolatile register bits are required for protecting the memory cells overall. As such, die sizes of conventional memory technologies and the amount of memory protected by a bit are inversely proportional. To minimize increases in die sizes, memory designers generally use one nonvolatile register bit to protect a block of memory, which might be an inflexible limitation for some applications. Another drawback is that the traditional nonvolatile register structures implement memory technologies, such as Flash memory and EEPROM, that require erase cycles. These erase cycles delay modification of the nonvolatile register bits, which, in turn, stalls operation of the storage device until the protection bits can be updated. Third, Flash-base memory storage devices also require Flash file management systems and code, which consumes resource. Fourth, other write protection enhancement circuits, including write protection-related memory, typically affect the die size as well.

There are continuing efforts to improve techniques, systems, and devices for protecting data stored in memory.

BRIEF DESCRIPTION OF THE DRAWINGS

The invention and its various embodiments are more fully appreciated in connection with the following detailed description taken in conjunction with the accompanying drawings, in which.

Figure 1:
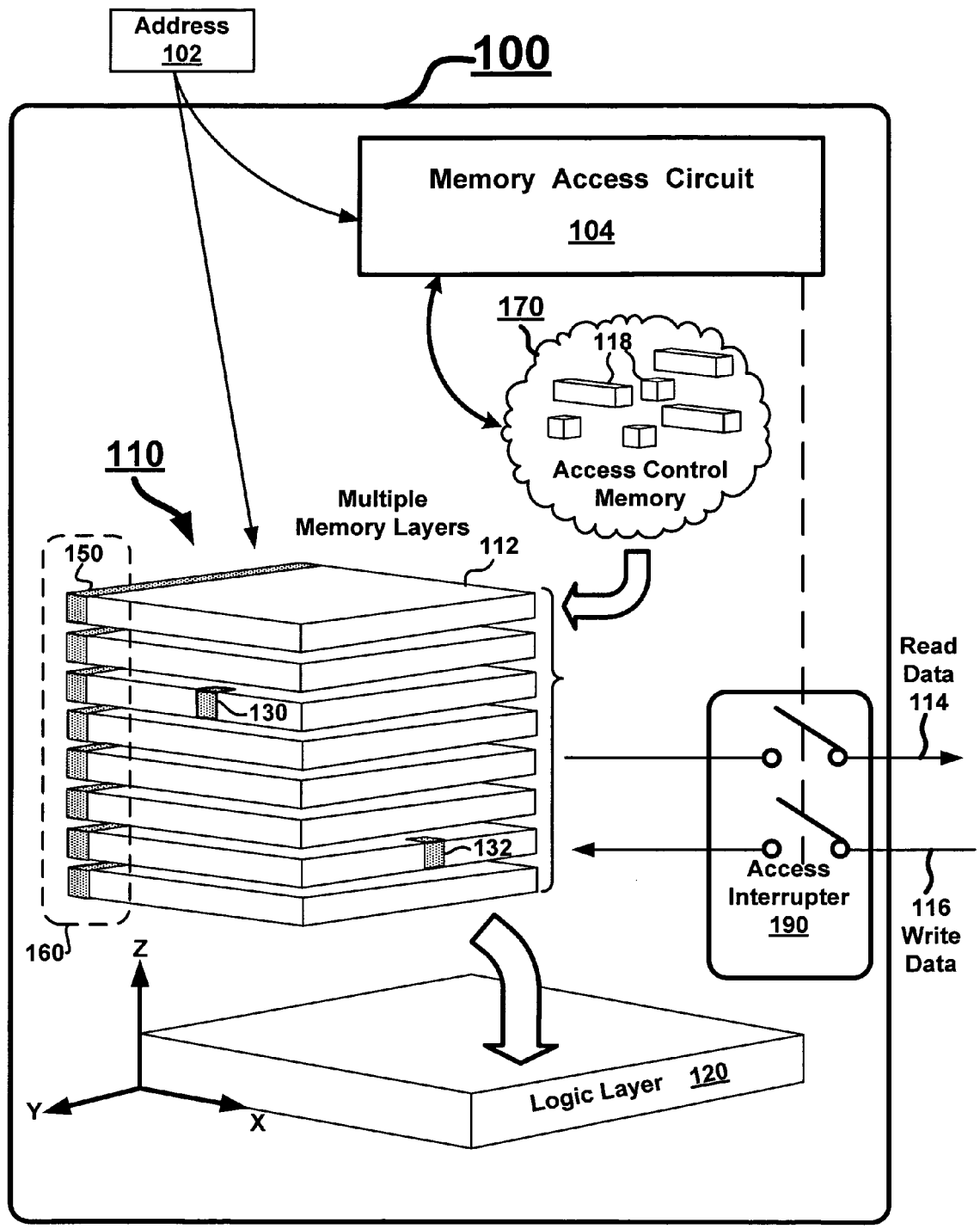
FIG. 1 illustrates an integrated circuit implementing a memory access circuit configured to control access to memory cells constituting multiple memory layers, according to at least one embodiment of the invention.

Like reference numerals refer to corresponding parts throughout the several views of the drawings. Note that most of the reference numerals include one or two left-most digits that generally identify the figure that first introduces that reference number. Although the Drawings depict various examples of the invention, the invention is not limited by the depicted examples. Furthermore, the depictions are not necessarily to scale.

DETAILED DESCRIPTION

FIG. 1 depicts an integrated circuit 100 implementing a memory access circuit configured to control access to memory cells constituting multiple memory layers, according to at least one embodiment of the invention. Integrated circuit 100 includes a memory access circuit 104, a memory 110 including multiple memory layers 112 formed on top of each other (e.g., in the Z dimension), access control memory 170, a logic layer 120, and an access interrupter 190. Memory 112 is configured to protect the contents of memory that otherwise would be available to be written or read, or both. In particular, memory access circuit 104 can control operation of access interrupter 190, in response to access control data in subsets 118, to either permit or prohibit access to data storage memory cells in memory 110. Thus, memory access circuit 104 can prevent unprivileged users from accessing read data 114 and/or using write data 116 to over-write data in memory 110. Memory access circuit 104, therefore, prevents unprivileged users from either reading data and/or code that might be proprietary in nature, or maliciously writing over information to corrupt data and/or code, or both.

As shown, multiple layers of memory 112 can include subsets 118 of access control memory 170, each including any number of memory cells that operate—in whole or in part—to control access to memory cells in memory 110. In one embodiment, at least one access control memory cell in one of subsets 118 of memory cells can be configured to control access to one or more other memory cells that are primarily used as data storage memory cells, whereby at least one memory cell in one of subsets 118 can reside in a different plane in memory 110 than the one or more data storage memory cells. For example, one or more access control memory cells 132, which form one of subsets 118 in access control memory 170, can reside in a different plane than one or more data storage memory cells 130. As used herein, a "plane" refers, at least in one embodiment, to a flat, conceptual surface passing containing, for example, the X and Y axes, the Y and Z axes, or the Z and X axes, as well as any similar surface that is parallel to any of the aforementioned axes.

In view of the foregoing, a memory designer can add access control memory 170 in memory 110 essentially without increasing the die size of, for example, a substrate to accommodate subsets 118 in logic layer 120. Specifically, adding access control memory 170 in multiple memory layers 112 predominantly affects the Z dimension of integrated circuit 100 rather than the X and Y dimensions. As such, implementation of access control memory 170 facilitates memory access control without increasing the die size to include access control memory 170 in logic layer 120 or on the substrate. It follows that the structures for both access control memory cells in subsets 118 and data storage memory cells in memory 110 can be distributed anywhere throughout multiple memory layers 112. Note that logic resides in logic layer 120 in accordance to various embodiments. As such, memory access circuit 104 and interrupter 190 of FIG. 1 (or portions thereof) can reside in logic layer 120. Note, too, that in some embodiments, access control memory 170 can include memory and/or memory cells that are vertically stacked over corresponding logic for access control memory 170 in logic layer 120. This can reduce the die area of integrated circuit 100, which otherwise would not be the case if the memory and/or memory cells access of control memory 170 were formed in a plane common with logic layer 120.

Memory access circuit 104 can be further configured to communicate with any of multiple memory layers 112 to determine access control data stored in any subset 118 of memory cells. As such, integrated circuit 100 can include a vertical arrangement of one or more subsets 118 of memory cells in multiple memory layers 112. One example of such an arrangement is vertical arrangement 160, which includes a number of vertically-displaced access control memory cells 150. In at least one embodiment, vertical arrangement 160 can include a variable amount of access control memory cells 150 without substantially increasing the size of logic layer 120 or a substrate in the X and Y dimension to include access control memory 170. As such, a memory designer can vary the quantity of access control memory cells 150 that are dedicated to control access to memory for the purposes of decreasing the granularity (i.e., the unit size) of data storage memory cells controlled by an access control datum, for example. Thus, increasing amounts of access control memory cells 150 can be implemented in vertical arrangement 160 to reduce the number of memory cells that are under the influence of an individual access control memory cell 150. For example, consider that increasing the quantity of access control memory cells 150 can decrease the unit size of data storage memory cells from a row (or sector) to a byte (or packet). So if a row formerly includes 512 bytes under the influence of one access control data bit, then the decrease in unit size adds an access control data bit for each of the remaining 511 bytes. This can be accomplished without adding access control memory cells 150 to logic layer 120 or a substrate, which otherwise would increase the die size. Thus, a memory designer can flexibly control the unit sizes in terms of layers 112, blocks, rows, or bytes, for example, that an individual access control memory cell 150 can control access thereto. Note that an individual access control memory cell 150 can control either a write access or a read access, or both, for any unit size of data storage memory cells. Note that the memory cells, such as access control memory cells 150, can be located in one plane or any number of planes. As such, FIG. 1 represents one example of an implementation.

Further, memory access circuit 104 can be configured to detect an access to memory cells 130, and, in response, control whether to access memory cells 130 in parallel with, or substantially in parallel with, the access itself. This is at least in part due to the collaboration of third dimension memories, which have relatively small sizes and fast access times, with memory access circuit 104, according to some embodiments. As such, a user will generally not experience noticeable time delays when accessing access control memory 170 to determine access control data. Additionally, parallel access to access control memory 170 facilitates expeditious write and/or read protection of memory 110, which otherwise might not be the case. As used herein, an "access" refers, at least in one embodiment, to a write operation (i.e., applying write data 116), a read operation (i.e., retrieving read data 114), or any other memory operation. In a specific embodiment, memory access circuit 104 functions to at least detect an address 102 for an access to a memory cell used to store user application data or code, for example. In at least one embodiment, memory access circuit 104 is a single memory access circuit providing access control for all of memory 110.

In at least one embodiment, the memory cells of memory 110 are third dimension memory cells. U.S. patent application Ser. No. 11/095,026, filed Mar. 30, 2005, U.S. Published Application No. 2006/0171200 A1, and titled "Memory Using Mixed Valence Conductive Oxides," is hereby incorporated by reference to describe one example of a third dimension memory cell. By using these types of third dimension memory cells, erase cycles are not required before writing write data 116 to memory cells of either memory 110 or access control memory 170. This obviates the need for a file management structure and/or methodology for managing write operations, among other things. By dispensing with the overhead associated with erase cycles and file management systems, integrated circuit 100 can implement access control of its memory cells in an expeditious manner, according to various embodiments of the invention. For example, writes to third dimension memory cells can be accomplished in 50 nanoseconds, or less.

A memory is a "third dimension memory" (or a third dimensional memory) when it is fabricated above other circuitry components, the components usually including a silicon substrate, polysilicon layers and, typically, metallization layers. By using non-volatile third dimension memory arrays, memory systems can be vertically configured to reduce die size, while preserving overall functionality of an integrated circuit. In at least one instance, a third dimension cell can be a two-terminal memory element that changes conductivity as a function of a voltage differential between a first terminal and a second terminal. The above referenced application describes two-terminal memory cells that can be arranged in a cross-point array. The application describes a two-terminal memory element that changes conductivity when exposed to an appropriate voltage drop across the two terminals. The memory element includes an electrolytic tunnel barrier and a mixed valence conductive oxide. The voltage drop across the electrolytic tunnel barrier causes an electrical field within the mixed valence conductive oxide that is strong enough to move oxygen ions out of the mixed valence conductive oxides and into the electrolytic tunnel barrier. Oxygen depletion causes the mixed valence conductive oxide to change its valence, which causes a change in conductivity. Both the electrolytic tunnel barrier and the mixed valence conductive oxide do not need to operate in a silicon substrate, and, therefore, can be fabricated above circuitry being used for other purposes (such as selection circuitry).

The two-terminal memory elements can be arranged in a cross-point array such that one terminal is electrically coupled with an x-direction line and the other terminal is electrically coupled with a y-direction line. A stacked cross-point array consists of multiple cross-point arrays vertically stacked upon one another, sometimes sharing x-direction and y-direction lines between layers, and sometimes having isolated lines. When a first write voltage $V_{W1}$ is applied across the memory element, (typically by applying ½ $V_{W1}$ to the x-direction line and ½ $-V_{W1}$ to the y-direction line) it switches to a low resistive state. When a second write voltage $V_{W2}$ is applied across the memory element, (typically by applying ½ $V_{W2}$ to the x-direction line and ½ $-V_{W2}$ to the y-direction line) it switches to a high resistive state. Typically, memory elements using electrolytic tunnel barriers and mixed valence conductive oxides require $V_{W1}$ to be opposite in polarity from $V_{W2}$.

Further, third dimension memory cells in memory 110 can be produced with equivalent fabrication processes that produce logic layer 120. As such, both can be manufactured in the same or different fabrication plants, or "fabs," to form integrated circuit 100 on a single substrate. This enables a manufacturer to first fabricate logic layer 120 using a CMOS process in a first fab, and then port logic layer 120 to a second fab at which additional CMOS processing can be used to fabricate multiple memory layers 112 directly on top of logic layer 120. The logic layer 120 can be formed on a substrate, such as a silicon (Si) wafer, for example. Note that memory 110 can be vertically stacked on top of logic layer 120 without an intervening substrate. An interlayer interconnect structure, such as vias or the like, can be used to electrically couple the memory 110 with the logic layer 120 that it is positioned on top of. In at least one embodiment, multiple memory layers 112 are fabricated to arrange the third dimension memory cells in a stacked cross point array. In particular, two-terminal memory elements can be arranged in a cross point array such that one terminal is electrically coupled with an X-direction line and the other terminal is electrically coupled with a Y-direction line. A stacked cross point array includes multiple cross point arrays stacked upon one another, sometimes sharing X-direction and Y-direction lines between multiple memory layers 112, and sometimes having isolated lines. Both single-layer cross point arrays and stacked cross point arrays may be arranged as third dimension memories.

Memory 110, which can also be referred to as a "memory array," or as a "main memory array," in some embodiments, can be implemented having memory elements arranged in blocks or sub-blocks. By utilizing third dimension memory, driving voltage requirements can be met by using multiple, smaller charge pumps in some cases. Further, multiple, simultaneous (or near simultaneous) accesses of memory elements in a memory array can be performed. While various types and designs of charge pump circuits can be used, the implementation of multiple, smaller charge pumps in a third dimension memory allows for die size to be reduced while improving the capabilities of integrated circuit 100, such as faster access times for performing multiple, simultaneous programmable sequences.

Figure 2:
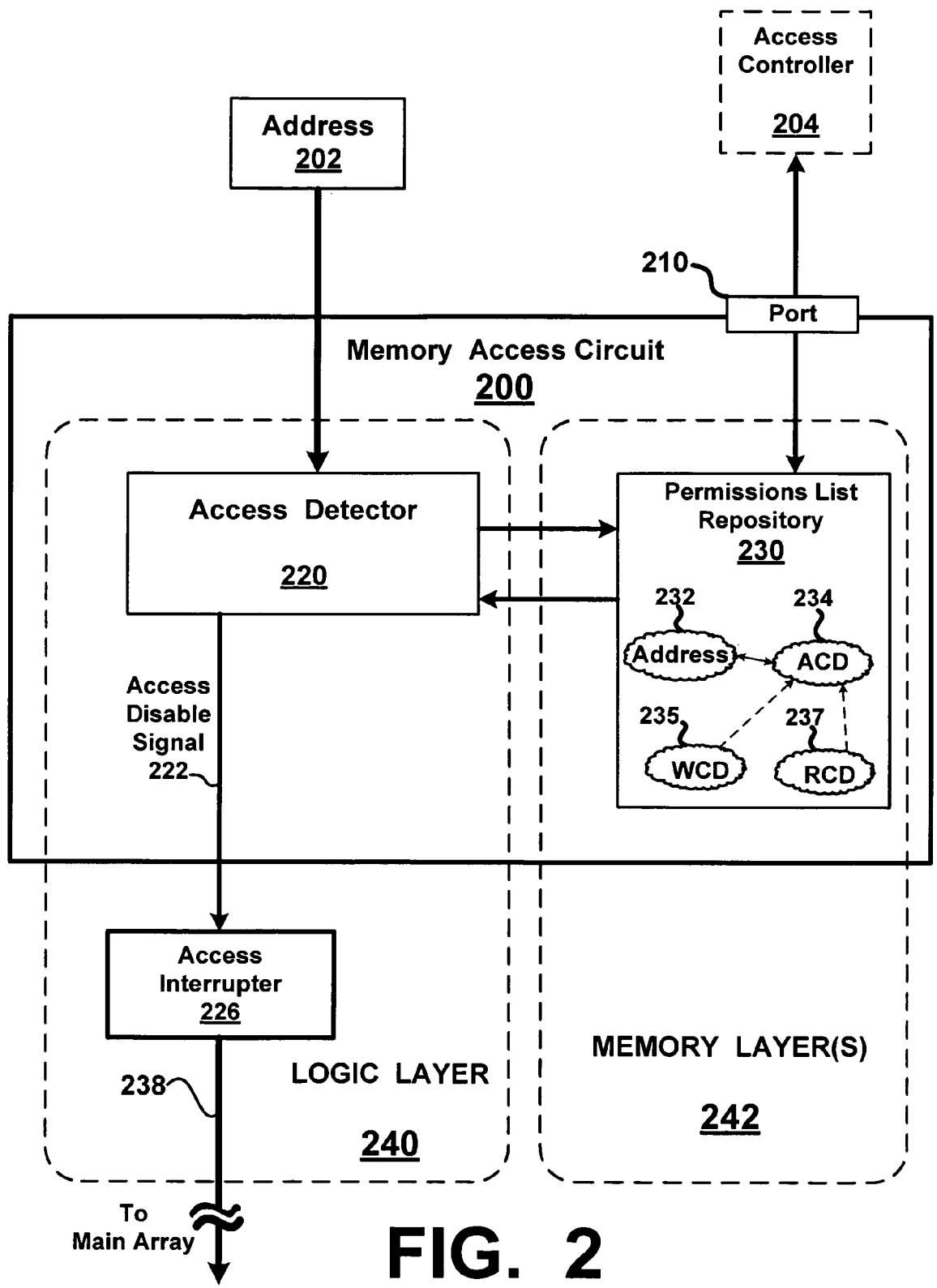
FIG. 2 is a block diagram detailing an example of a memory access circuit, according to one embodiment of the invention.

FIG. 2 is a block diagram depicting an example of a memory access circuit 200, according to one embodiment of the invention. In this example, memory access circuit 200 includes an access detector 220 and a permissions list repository 230, which can be configured to store access control data ("ACD") 234 (or datum, such as an access control bit) for addresses that have controllable access, such as address 202. As such, permissions list repository 230 can serve as access control memory. In operation, access detector 220 is configured to detect an address 202 for accessing one or more third dimension memory cells in a memory location. Upon detecting address 202, access detector 220 identifies access control data 234 for address 202. In one embodiment, access detector 220 accesses permissions list repository 230 to match address 202 against a number of addresses 232. Upon detecting a match, access detector 220 reads access control data 234. Responsive to access control data 234, access detector 210 can generate an access disable signal 222 to disable access to the memory location associated with address 202. In at least one embodiment, memory access circuit 200 can be configured to enable or disable the access with the memory location in parallel to, or substantially in parallel to, detecting address 202.

As depicted in FIG. 2, memory access circuit 200 can transmit access disable signal 222 to an access interrupter 226, which operates to suppress access operations corresponding to address 202. In particular, memory access circuit 200 can be configured to control either write operations or read operations with a main array by sending access disable signal 222 to access interrupter 226. In one embodiment, access interrupter 226 is configured to interrupt application of an access voltage 238 to data storage memory cells, thereby prohibiting access. Specifically, access interrupter 226 can be configured to interrupt application of a write access voltage 238 to data storage memory cells, if the access is a write, and interrupt application of a read access voltage 238 to data storage memory cells, if the access is a read. When access control data 234 includes states permitting both writing and reading with the memory location of address 202, then write access and read access voltages 238 are respectively applied to the main array.

In one embodiment, memory access circuit 200 includes a port 210 configured to receive address 202 from an access controller 204. In operation, access controller 204 is configured to program access control data 234, and relationships to, various applicable addresses 232 in permissions list repository 230. In some cases, access controller 204 can be production test equipment configured to program permissions list repository 230 at, for example, wafer sort. In other cases, access controller 204 can be integrated into a circuit including memory access circuit 200, thereby providing for in-situ access control in view of security issues arising during use in memory applications.

In some embodiments, memory access circuit 200 includes a first portion 240 formed in a logic layer and a second portion 242 being formed in one or more layers in a third dimension memory. In particular, first portion 240 can include at least a portion of access detector 220, and second portion 242 can include storage for a permissions list repository 230. Both portions 240 and 242 can be formed using a CMOS fabrication process. In at least one embodiment, a portion of access detector 220 can include a part of permissions list repository 230 (e.g., addresses 232 and/or relationships to access control data 234), for example.

In various embodiments, access control data 234 can be configured to include access control information for any number of access operations. In one embodiment, access control data 234 can include data (or a datum) representing write control data ("WCD") 235 for controlling write operations and/or read control data ("RCD") 237 for controlling read operations. For example, write control data 235 and read control data 237 can include a write protect bit and a read protect bit, respectively, to permit or prohibit write and read access to address 202. In a specific embodiment, permissions list repository 230 is implemented as a look up table ("LUT"). In particular, permissions list repository 230 can include an address space that includes the same addresses 232 as the main memory array (e.g., memory 110). One or more access control data bits are stored at each address of permissions list repository 230. So a single data bit can be stored as, for example, a write protect bit at each address of permissions list repository 230. Thus, the write protect bits each can have states indicating whether to permit or prohibit writing to the same addresses in the main memory. In operation, a read operation upon address 202 of permissions list repository 230 outputs a write protect data bit as access disable signal 222 during a write operation. So, when address 202 is applied to the main memory array, it also is applied in parallel to permissions list repository 230 to generate a write protect bit and/or a read protect bit as an output. In some embodiments, access control data 234 in permissions list repository 230 can correspond to a group of addresses in the main memory array, thereby controlling access to a group of addresses rather than individual addresses in the main memory array.

Figure 3:
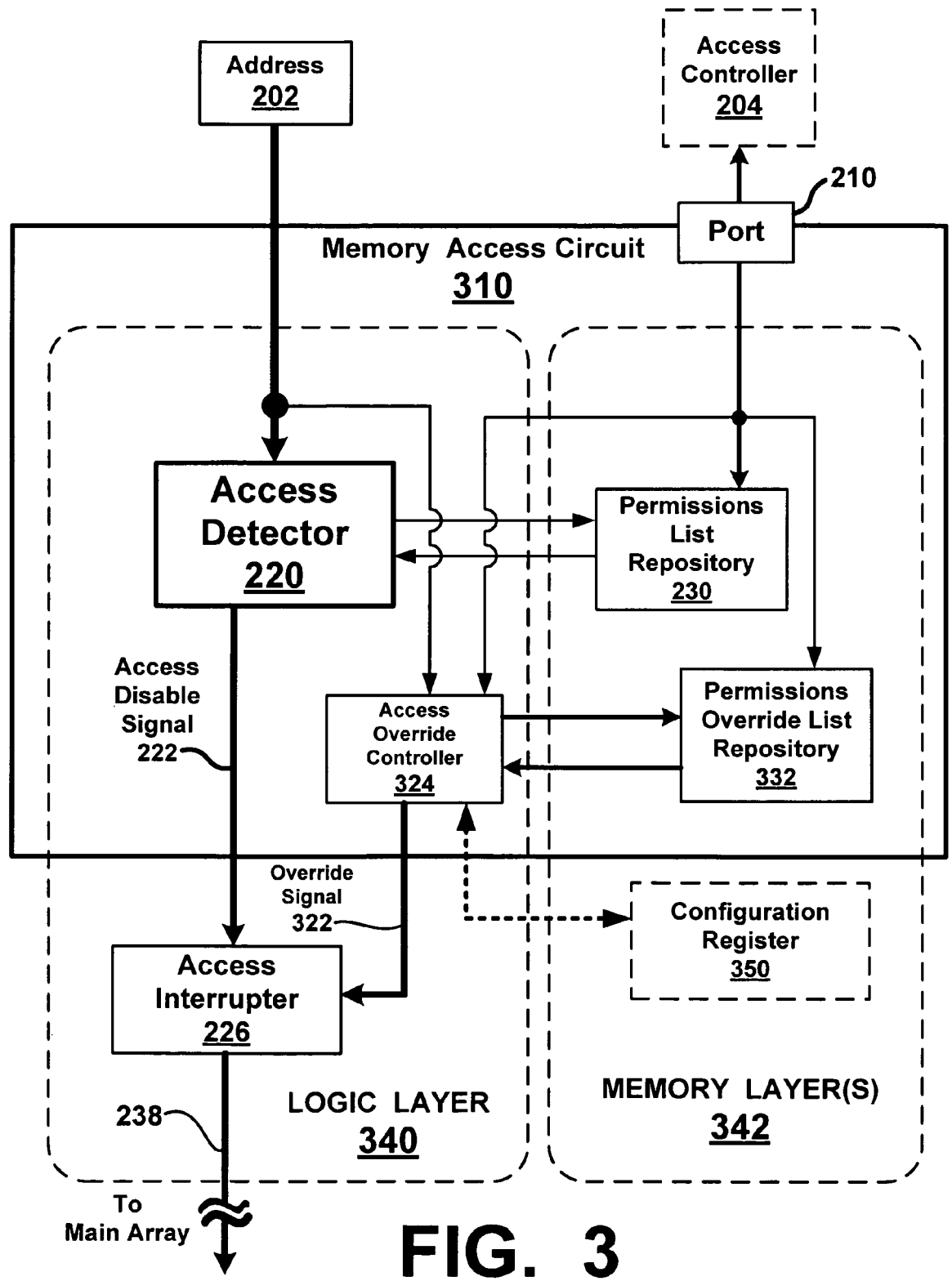
FIG. 3 is a block diagram detailing another example of a memory access circuit, according to another embodiment of the invention.

FIG. 3 is a block diagram depicting another example of a memory access circuit 310, according to another embodiment of the invention. In this example, memory access circuit 310 includes an access detector 220, a permissions list repository 230, an access override controller 324, a permissions override list repository 332, and optional configuration register 350 as configuration memory. Permissions override list repository 332 is configured to store access control override data that subjugates permissions list repository 230 and its access control data. While any user can alter the contents of permissions list repository 230, only authorized users can alter the contents of permissions override list repository 332. Access control override data can include one or more bits that represent write protect bits, read protect bits, or any other bit configured to arrest access (e.g., prevent a data operation to memory). The states of bits for access control override data take priority over those bits of permissions list repository 230. Access override controller 324 is configured to detect address 202 and determine whether to override permissions list repository 230 for permitting or prohibiting access to one or more memory locations associated with address 202. Thus, access override controller 324 operates to neutralize access control data and/or access detector 220 by seizing control of accesses to a third dimension memory. Note that similarly-named elements that are also shown in both FIGS. 2 and 3 can have equivalent functions and/or structures.

In operation, access override controller 324 compares address 202 against addresses stored in permissions override list repository 332. In one embodiment, access override controller 324 accesses an address corresponding to address 202 in permissions override list repository 332 to read out access control override data. In response, access override controller 324 generates an override signal 322 for transmission to access interrupter 226. Override signal 322 is configured to override access disable signal 222. In one embodiment, access controller 204 can program access control override data via port 210 into permissions override list repository 332. Further, access controller 204 can program a password via port 210 into configuration register 350. As such, an authorized user that possesses a password can limit the functionality of permissions list repository 230. In some embodiments, memory access circuit 310 includes a first portion 340 formed in a logic layer and a second portion 342 being formed in one or more layers in a third dimension memory. The second portion may be formed on top of the first portion, that is, the second portion can be in contact with and positioned on top of the first portion. In some instances, first portion 340 can also include at least a portion of access override controller 324 and at least a portion of access detector 220, and second portion 342 can include storage for permissions override list repository 332, configuration register 350, which can be optional, and permissions list repository 230.

Figure 4A:
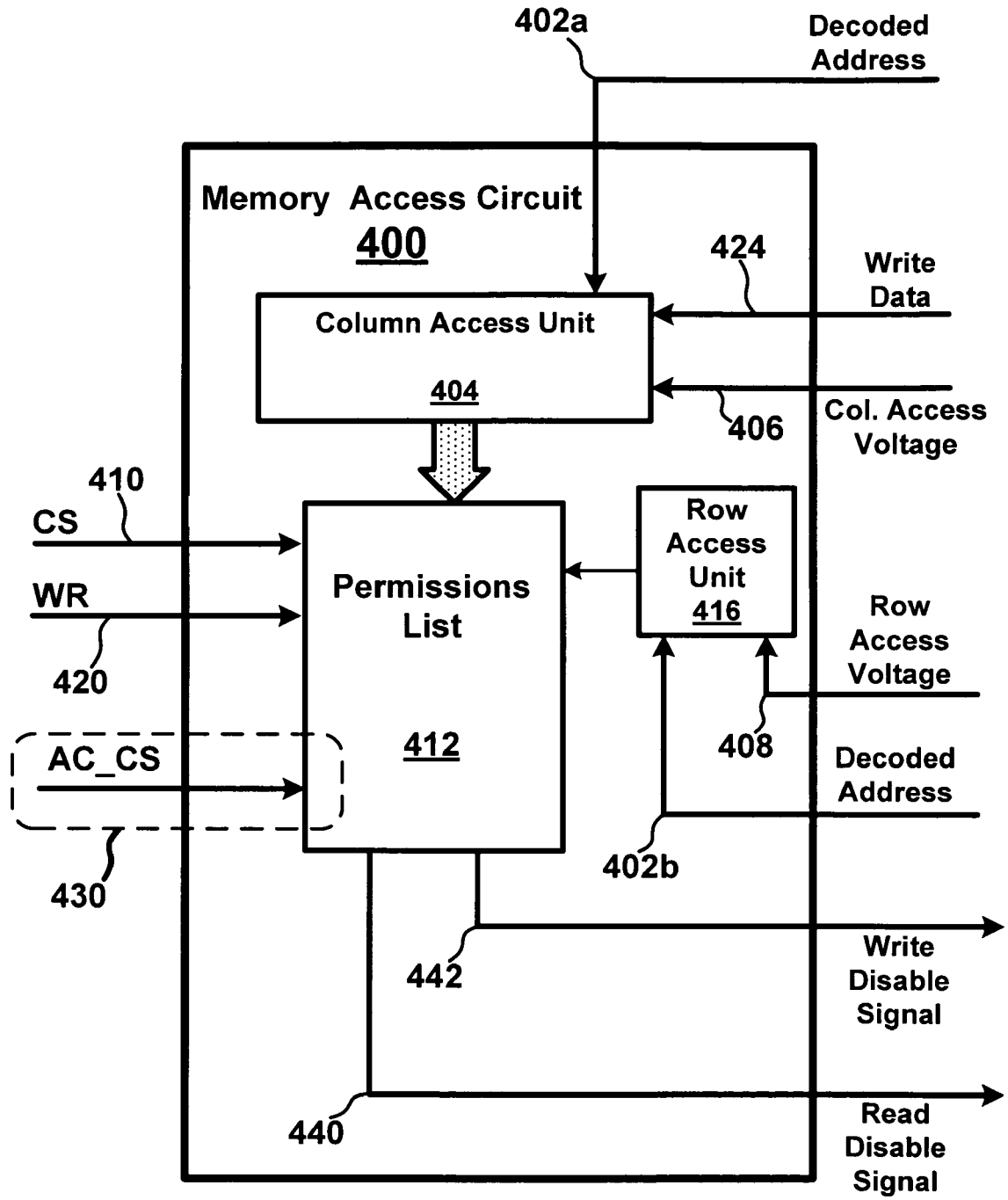
FIG. 4A depicts an example of a memory access circuit, according to one embodiment of the invention.

FIG. 4A depicts an example of a memory access circuit 400, according to one embodiment of the invention. Memory access circuit 400 includes a column access unit 404, storage for a permissions list 412, and row access unit 416. Memory access circuit 400 is configured to operate in two modes: a programming mode and a functional mode. In programming mode, permissions list 412 is programmed to record a list of memory locations requiring access control. A decoded address 402b selects the row into which write data 424 is to be programmed. As access control data, write data 424 can include write protect and/or read protect bits, according to one embodiment. In another embodiment, write data 424 can represents a memory address and at least a relationship to access control data.

Programming can be initiated in a number of ways. In a first embodiment, a chip select signal ("CS") 410, write enable signal ("WR") 420, and an access control chip select signal ("AC_CS") 430 can be applied to memory access circuit 400 to program a third dimension memory constituting permissions list 412. Column access unit 404 and row access unit 416 cooperate to program permissions list 412. For example, column access unit 404 can logically AND a column access voltage 406 (e.g., "Col. Access Voltage") with select address bits of decoded address 402a to determine which column lines (e.g., Y-lines) will be driven with Write Data 424. In one example, the select column bits are determined by a column decoder (not shown). Row access unit 416 performs a similar function, but rather determines a unique row for programming. For example, row access unit 416 can logically AND a row access voltage 408 (e.g., a "Row Access Voltage") with select decoded row bits as decoded address 402b, thereby applying voltages to a unique row line (e.g., X-line).

Figure 4B:
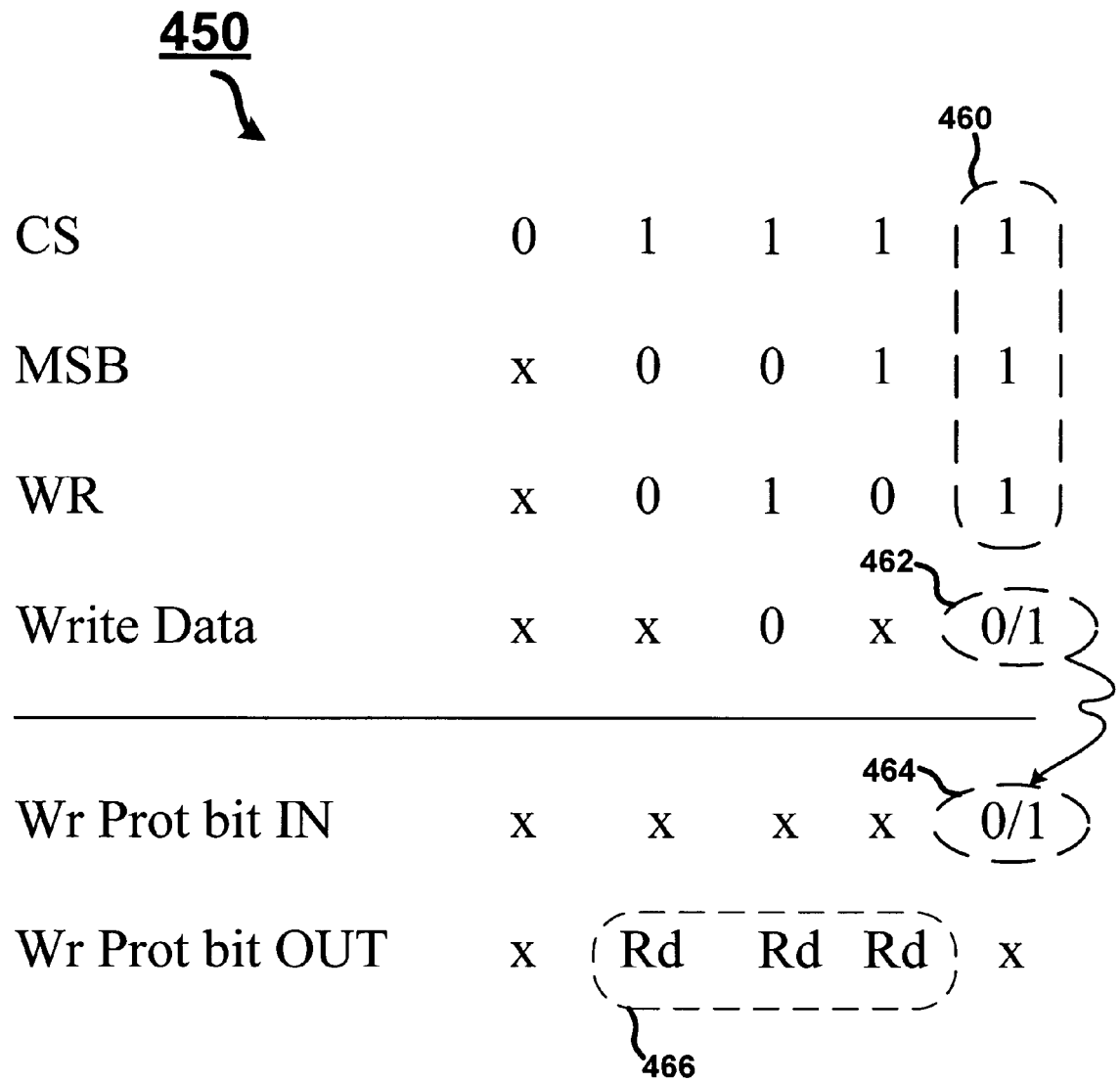
FIG. 4B depicts an example of a decode table for programming access control data, according to one embodiment of the invention.

In a second embodiment, access control chip select signal 430 is omitted and the addresses in permissions list 412 can be set above the memory address range of the main memory array to avoid access to the main array during programming mode. For example, when the most significant bit ("MSB") of an address is "0," data can only be read from permissions list 412, whereas when the MSB of the address is "1," memory access circuit 400 is in programming mode and permissions list 412 can be programmed. As shown in a decode table 450 depicted in FIG. 4B, when signals 460 representing chip select signal ("CS") 410, write enable signal ("WR") 420, and MSB are each "1," then memory access circuit 400 is in programming mode. Accordingly, write data 462 (e.g., 0/1) will be programmed into permissions list 412 as, for example, "Wr Prot bit IN" data 464. Otherwise, memory access circuit 400 is in functional mode, whereby the contents of permissions list 412 can be read as "Wr Prot bit OUT" data 466. Note that the polarity usage of the MSB can be reversed (e.g., MSB of "0" permits programming of permissions list 412). In various embodiments, the magnitudes of the access voltages for the columns and row can be set to values that are appropriate for third dimension memory cells, for example.

Referring back to FIG. 4A, consider that permissions list 412 is accessed during write and read operations to the main memory array when memory access circuit 400 operates in functional mode. During write operations to a particular address in a main memory array, permissions list 412 can output the contents from that address in permissions list 412. If the contents are configured to prohibit writing, then an active Write Disable Signal 442 has a low state during a write to data storage memory (not shown). It is the low state of active Write Disable Signal 442, in this example, that causes an access interrupter (not shown) to interrupt application of write access voltages to the main memory array, thereby preventing modification of the data stored in the main memory array. But if the contents are configured to permit writing, then an inactive Write Disable Signal 442 having a high state during a write is applied to an access interrupter. It is the high state of inactive Write Disable Signal 442, in this example, that causes an access interrupter to refrain from interrupting write access voltages to the main memory array, thereby enabling modification of the data stored in the main memory array. In at least one embodiment, permissions list 412 includes only one bit—a write protect bit—for each address in the main memory array, and operates as described above.

In another embodiment, permissions list 412 includes either only one other bit or other supplemental bits. For example, the other one bit can be a read protect bit that is also stored in permissions list 412 for each address in the main memory array. During read operations to a particular address in a main memory array, permissions list 412 can output the contents from that address in permissions list 412. If the contents are configured to prohibit reading, then an active Read Disable Signal 440 has a low state during a read to data storage memory (not shown). It is the low state of active Read Disable Signal 440, in this example, that causes an access interrupter (not shown) to interrupt application of read access voltages to the main memory array, thereby preventing the reading of the data stored in the main memory array. But if the contents are configured to permit reading, then an inactive Read Disable Signal 440 having a high state during a read operation is applied to an access interrupter, which causes the access interrupter to refrain from interrupting read access voltages to the main memory array. This enables the reading of the data stored in the main memory array.

When an access to a memory address is detected, memory access circuit 400 transmits access disable signal(s) (e.g., a Read Disable Signal 440 and a Write Disable Signal 442) to suppress at least the write and read operations with the main array. Also, memory access circuit 400 accesses permissions list 412 to determine access control data. Both of these events can occur in parallel (or substantially in parallel). In operation, read voltage levels generated by both column access voltage 406 and row access unit 416, as well as decoded X-line address 402b and decoded Y-line address 402a, are applied to permissions list 412. Permissions list 412 can then examined in parallel with main array access operations.

In one embodiment, each address of permissions list 412 corresponds to an address of the main memory array and includes two bits: a write protect bit and a read protect bit. In some embodiments, both bits are read out of permissions list 412, whenever the address is accessed, as read disable signal 440 and write disable signal 442. In other embodiments, the write protect bit is output when write enable signal 420 is active (i.e., in a high state), whereas the read protect bit is output when write enable signal 420 is inactive (i.e., in a low state).

Figure 5:
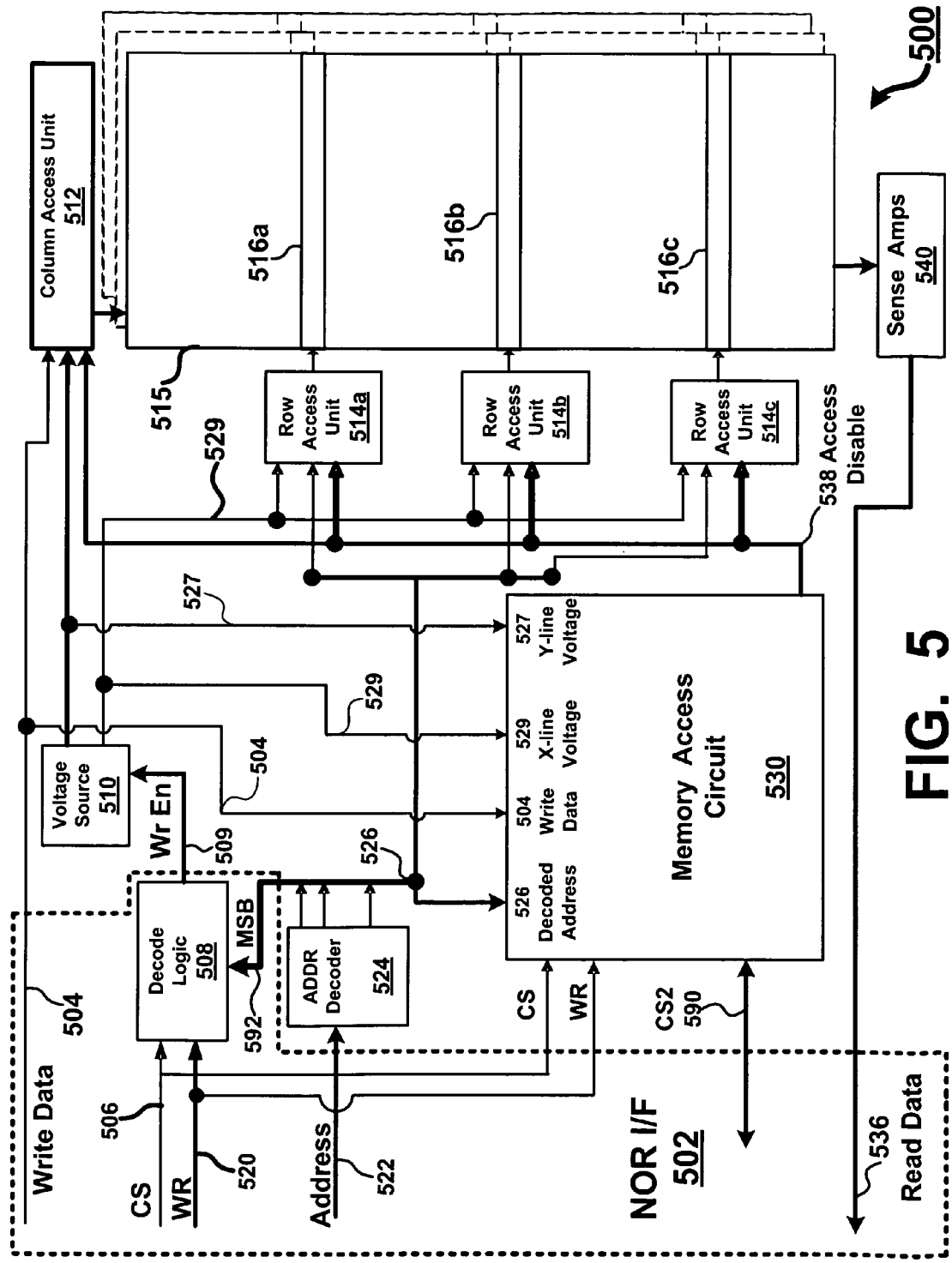
FIG. 5 depicts an example of a memory access circuit implemented in a memory architecture that includes a NOR-type interface, according to one embodiment of the invention.

FIG. 5 depicts an example of a memory access circuit implemented in a memory architecture that includes a NOR-type interface, according to one embodiment of the invention. As shown, memory architecture 500 includes a NOR-type interface ("NOR I/F") 502, an address ("ADDR") decoder 524, a voltage source 510, a column access unit 512, a number of row access units 514, sense amplifiers ("Sense Amps") 540 and a third dimension memory array 515. Memory access circuit 530, which operates in accordance to various embodiments as described herein, is configured to control access to memory locations in array 515 that otherwise would be available without restriction. Memory access circuit 530 can be programmed with access control data using either a second chip select ("CS2") 590 or a most significant bit ("MSB") 592.

Address ("ADDR") decoder 524 is configured to decode address 522 into a decoded address 526, which relates to one of the outputs of address decoder 524 (i.e., one of many X decode lines). Voltage source 510 is configured to generate read voltages and write voltages as row access voltage ("X-line Voltage") 529 and column access voltage ("Y-line Voltage") 527, both of which can be applied to row access units 514 and column access units 512, respectively. Row access units 514 and column access unit 512 operate in an equivalent manner as similarly-named elements described in FIG. 4A. Row access units 514a, 514b, and 514c each operate to uniquely select a row, such as rows 516a, 516b, and 516c, respectively. In the example shown, memory access circuit 530 is configured to transmit an access disable signal 538 to each row access unit 514 and column access unit 512 to disable writes and reads to array 515, when an access relates to memory having write and read permissions set forth as access control data. For example, decoded address 526, row access voltage 529 and access disable signal 538 can be logically ANDed together such that when access disable signal 538 is low, all accesses to the rows 516 are disabled. Sense amplifiers ("Sense Amps") 540 are configured to sense and generate read data for transmission as read data 536, when memory access circuit 530 permits access to array 515 during read operations.

NOR-type interface ("NOR I/F") 502 is configured to provide control signals, address signals and data signals for accessing third dimension memory in either array 515 or the permission list repository in memory access circuit 530, or both. As shown, NOR-type interface 502 is adapted to provide separate channels for write data 504, address 522, and read data 536. Further, NOR-type interface 502 provides channels for chip select ("CS") 506 and write enable ("WR") 520 signals. NOR-type interface 502 includes decode logic 508 for generating an internal write enable signal ("Wr En") 509 to cause voltage source 510 to transmit write and/or read access voltages. As different memory technologies can implement NOR-type interfaces 502, such as SRAM devices, memory architecture 500 can emulate SRAM memory technologies, as well as NOR Flash memory technologies and the like. As such, the permission list repository in memory access circuit 530 can be configured to store access control data for individually-addressable bytes. Each row in array 515 can be organized to include any number of bits, such as 8, 16, 32 and 64 bits wide. In some cases, the widths are determined for data bus widths for specific processors. Note that NOR-type interface 502 can implement more or fewer signals, as necessary, to emulate different memory technologies. Note, too, that while FIG. 5 depicts array 515 as one memory plane (e.g., implement in one layer of multiple memory layers), other arrays 515 in the Z dimension are shown in dashed lines.

Figure 6:
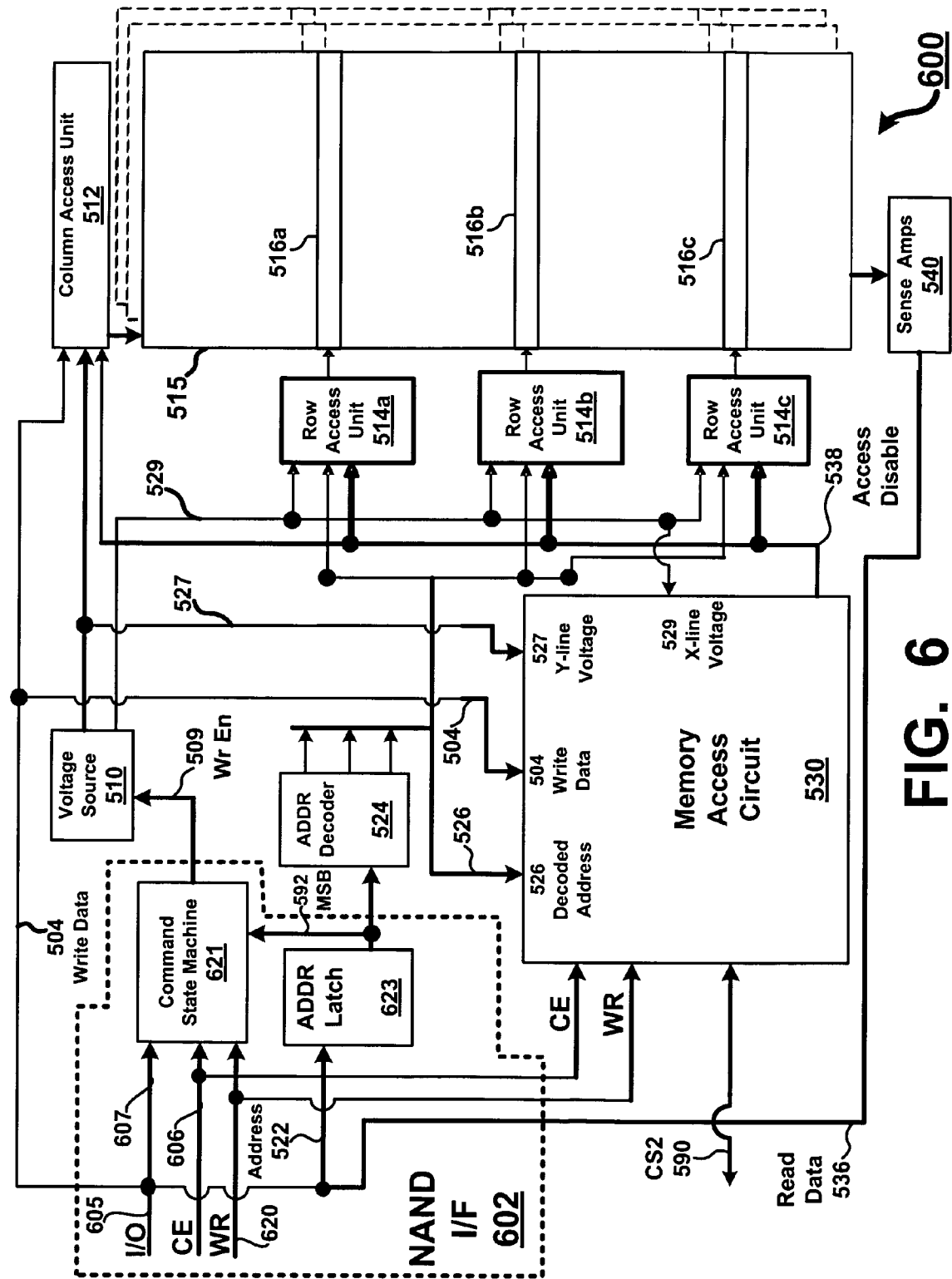
FIG. 6 depicts an example of a memory access circuit implemented in a memory architecture that includes a NAND-type interface, according to another embodiment of the invention.

FIG. 6 depicts an example of a memory access circuit implemented in a memory architecture 600 that includes a NAND-type interface, according to another embodiment of the invention. As shown, memory architecture 600 includes a NAND-type interface ("NAND I/F") 602, as well as an address ("ADDR") decoder 524, a voltage source 510, a column access unit 512, a number of row access units 514, sense amplifiers ("Sense Amps") 540, a third dimension memory array 515, and memory access circuit 530. Note that elements in FIG. 6 that are also shown in FIG. 5 have similar functions and/or structures. Memory access circuit 530 can be programmed with access control data using either a second chip select ("CS2") 590 or a most significant bit ("MSB") 592. Or, in some embodiments, a command can be created that provides for accessing the permissions list repository in memory access circuit 530.

NAND-type interface ("NAND I/F") 602 is configured to provide control signals, address signals and data signals for accessing third dimension memory in either array 515 or a permissions list repository in memory access circuit 530, or both. As shown, NAND-type interface 602 is adapted to provide a shared bus for write data 504, address data 522, read data 536, and command data 607 constituting commands. The shared bus is shown as I/O bus 605. Further, NAND-type interface 602 provides channels for chip enable ("CE") 606 and write enable ("WR") 620 signals. NAND-type interface 602 includes command state machine 621 configured to implement commands for performing, for example, write and read operations. When writing, command state machine 621 can generate, for example, an internal write enable signal ("Wr En") 509. Address latch ("ADDR Latch") 623 is configured to receive an address 522, generally over multiple bus cycles, and to latch the address 522 until used. Note that NAND-type interface 602 can implement more or fewer signals, as necessary, to emulate different memory technologies. Examples of such signals include address latch enable and command enable signals.

As different memory technologies can implement NAND-type interfaces 602, such as DRAM devices, memory architecture 600 can emulate DRAM memory technologies, as well as NAND Flash memory technologies and the like. Consider, for example, that memory architecture 600 is configured to emulate NAND Flash memory. As such, array 515 can be partitioned into blocks with access control for memory cells being made at the sector-level (i.e., row-level), in some embodiments. In at least one embodiment, access control for memory cells can be in groups of memory cells, such as a byte. Or, accesses to memory cells can be controlled individually. In one instance, rows 516 can include 512 bytes or more bytes. As such, the permissions list repository in memory access circuit 530 can be divided to control access to individually-addressable sectors, or rows, of 512 bytes (plus any extra bytes) in the main array 515, or groups thereof. Vertically-arranged third dimension memory cells can emulate DRAM and SRAM technologies, according to various embodiments. As such, the above-described structures and/or techniques for write protecting and read protecting memory technologies can be applied to emulated DRAM technologies and emulated SRAM technologies, as well as emulated Flash memory technologies. In one embodiment, NAND-type interfaces 602 can be implemented as a DRAM interface to interface with, for example, an emulated DRAM. In one embodiment, NOR-type interface 502 of FIG. 5 can be implemented as an SRAM interface to interface with, for example, an emulated SRAM.

Figure 7:
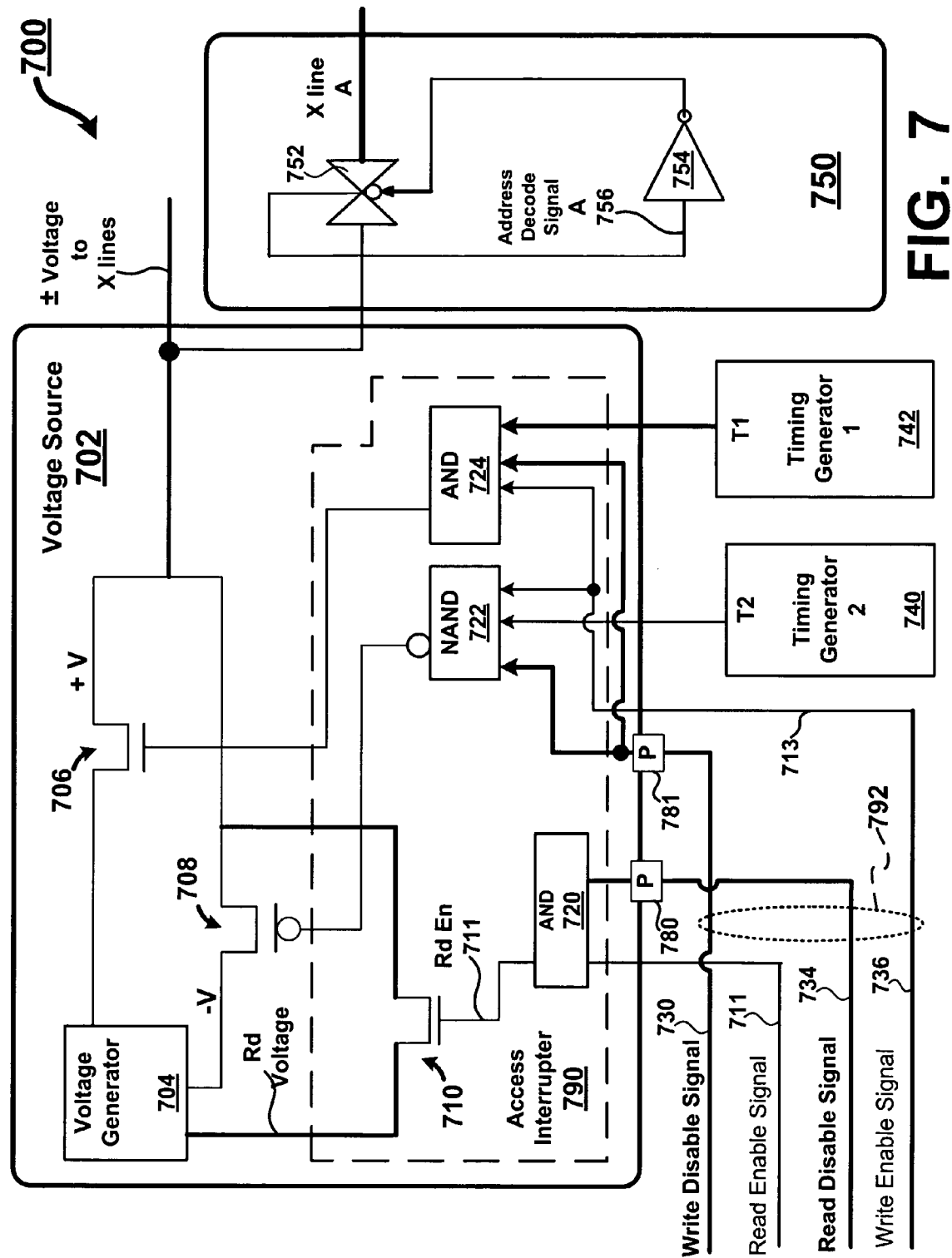
FIG. 7 is a diagram depicting an example of a voltage source implementing an access interrupter that collaborates with a memory access circuit, according to an embodiment of the invention.

FIG. 7 is a diagram depicting an example of a voltage source 700 implementing an access interrupter in collaboration with a memory access circuit, according to an embodiment of the invention. In the example shown, voltage source 700 can be configured as an interruptible voltage source 702 having a write disable signal port ("P") 781 and a read disable signal port ("P") 780. As such, interruptible voltage source 702, which typically provides access voltages to a main array, can include an access interrupter 790 for interrupting the transmission of the access voltages in response to an either a read disable signal 734 at port 780 or a write disable signal 730 at port 781. In this example, read disable signal 734 and write disable signal 730, which constitute a portion of signals 792, need not be routed to row access units and column access units as described in other embodiments.

Voltage source 700 includes a voltage generator 704 configured to generate read voltages and write voltages as access voltages. It also includes devices 710, 708, and 706 for disabling transmission of access voltages to, for example, a row having access restricted. Logic circuits 722 and 724 are configured to respectively control operation of devices 708 and 706 in response to write disable signal 730 that, when low, disables writes to a particular row. Logic circuits 720 is configured to control operation of device 710 in response to read disable signal 734 that, when low, disables reads to a particular row. Access interrupter 790 is also configured to receive read enable signal 711 when, for example, a chip select signal (not shown) is active, but write enable signal ("Wr") 736 is inactive. But when write enable signal 736 is active, logic circuits 722 and 724 enable writes to the main array.

Timing generator ("1") 742 and timing generator ("2") 740 cooperate, when write disable signal 730 is high (i.e., inactive), to generate timing signals to control the alternating application of negative write voltages ("−V") to write zeroes and positive write voltages ("+V") to write ones. Writing in this manner, at least for some third dimension memory cells, is a two-cycle operation with a positive voltage applied at T1 and a negative voltage applied at T2, both producing the positive and negative voltages driven down the row line selected by an address decode signal ("A") 756, which implements a circuit 750 to send an access voltage down the row for reading. Circuit 750 is an example of a gating circuit that includes an inverter 754 and a transmission gate 752, which enables transmission of a row access voltage to a single row as determined by address decode signal 756. In an alternative embodiment, data can be read protected, (e.g., the data cannot be read) by blocking the data path so that data cannot be read from the array. In other embodiments, zeroes, ones or any other random data can be substituted in place of array data being read out, thereby obfuscating the data in memory.

Figure 8:
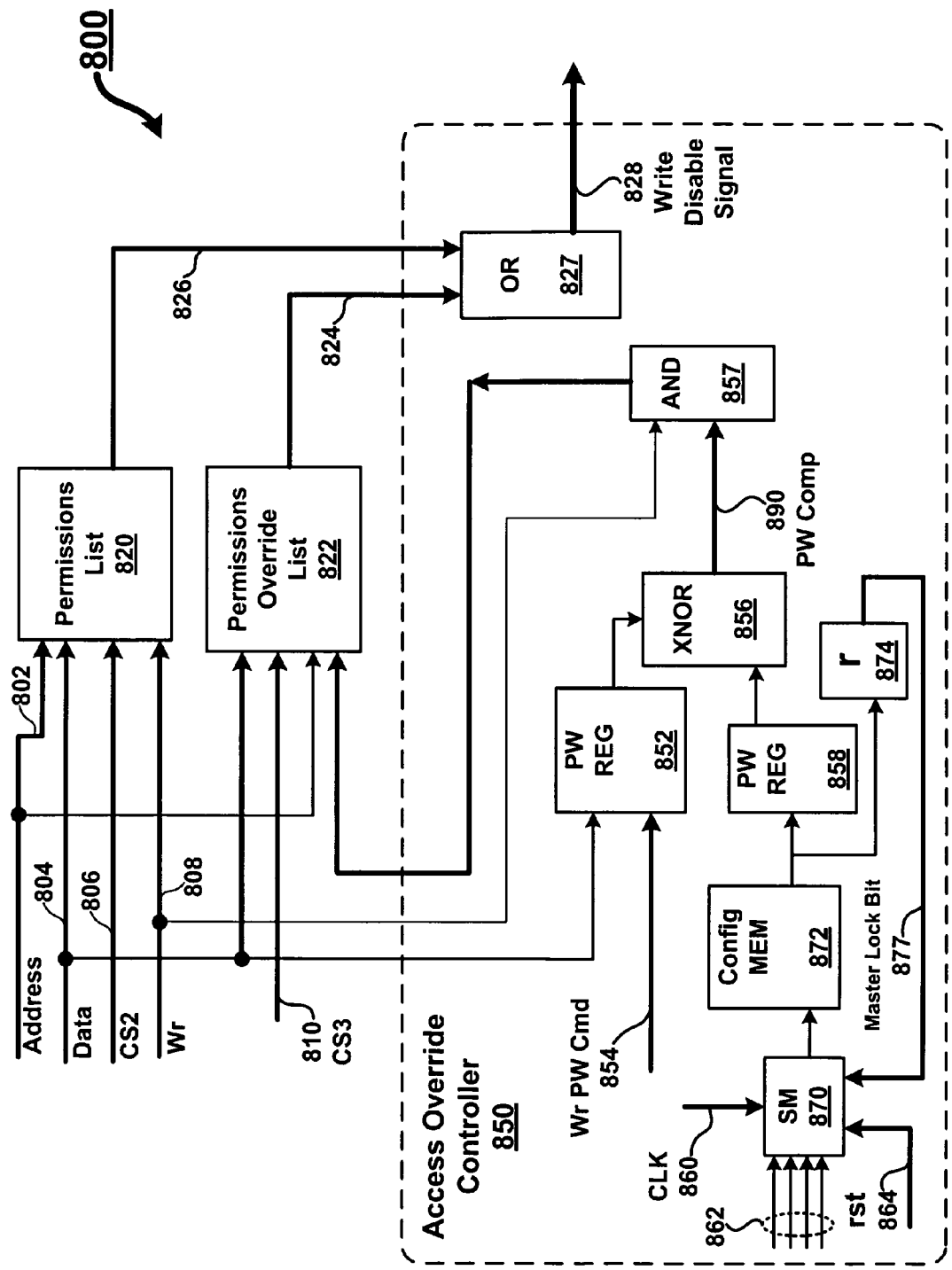
FIG. 8 is a block diagram depicting an example of an access override controller implementing third dimension memory for storing access control data, according to an embodiment of the invention

FIG. 8 is a block diagram depicting an example of a password protection circuit 800 with an access override controller 850 that includes a third dimension memory for storing access control data, according to an embodiment of the invention. In the example shown, access override controller 850 can be configured to implement access control override data in permissions override list repository 822 to override operation of access control data in permissions list repository 820. Address bus 802, data bus 804, and write data bus 808 are each used to program access control override data and access control data into permissions override list repository 822 and permissions list repository 820, respectively. Second chip select number ("CS2") 806 and third chip select ("CS3") 810 are used to respectively select permissions override list repository 822 and permissions list repository 820 for programming. Permissions override list repository 822 outputs an override signal 824 and permissions list repository 820 outputs an access disable signal 826, whereby access override controller 850 generates a write disable signal 828, for example, using an OR gate 827.

Note that, as previously described, the permissions list repository 820 can be used to disable accesses based on the address of the memory in some cases. But in some other cases, hackers might change data representing the access permissions, thereby allowing proprietary data to be altered or read without authorization. As is described next, password protection circuit 800 can be used to prevent this, according to at least one embodiment of the invention. If the password in configuration memory ("Config MEM") 872 is left unprogrammed, then no password compare will result (indicating that the circuitry is disabled), with password protection circuit 800 functioning as previously described (e.g., without functionality of access override controller 850). If, however, a password is loaded into the non-volatile configuration register of password register ("PW REG") 852, which can be made from third dimension memory, then password functionality will be enabled for password protection circuit 800. To set the configuration memory password, a corresponding value can be programmed into the password register ("PW REG") 858 to allow access to permissions memory (i.e., permissions override list repository 822). In this way, a user can protect the data representing permissions list repository 820, which can be implemented as a look-up table, from being altered by a hacker. For example, a user (e.g., a master user or administrator) can set configuration memory 872 to some secret value that would be required to be loaded into password register ("PW REG") 858 if programming permission override list repository 822 was to occur. Permission override list repository 822 can be like a master list of access permits (e.g., a listing of addresses) that ordinary users (i.e., users without administrative access) cannot change. In typical operation, users can alter the access permits by changing data in permission list repository 820. But if a master user (or administrator) has designated some area of the memory as being unalterable (i.e., write protected) by the settings in permission override list repository 822, the data representing list permission override list repository 822 can override the users' general access capabilities with the memory.

While permissions list repository 820 is configured to be accessed by all users, permissions override list repository 822 is configured for access only by users with password knowledge. If an unauthorized user tries to alter a protected region of the main memory array by altering permissions list repository 820, then the contents of permissions override list repository 822 can override the user's inputs to maintain a desired level of protection against unauthorized data modifications to the region of memory. To access permissions override list repository 822, a write to a specific address with a specific code value can be required, according to one embodiment. This can be referred to as an unlock sequence. Note that while FIG. 8 describes a write protect scheme, it can also apply to controlling other types of accesses (e.g., a read access).

Access override controller 850 includes an initialization state machine ("SM") 870, a configuration memory ("Config MEM") 872, as a configuration register, a first password register ("PW REG") 858, a second password register ("PW REG") 852, a logic gate 856 for determining whether passwords match, a logical AND gate 857, and a logical OR gate 827. Initially, a password value is stored in first password register ("PW REG") 858, for example, during manufacturing. So long as the contents of first password register ("PW REG") 858 and second password register ("PW REG") 852 fail to match, data in permissions override list repository 822 cannot be altered.

In one embodiment, initialization state machine 870, upon receiving a reset ("rst") 864 and a clock ("CLK") 860 on power-up, loads a preset password into first password register ("PW REG") 858. An authorized user enters that preset password into second password register ("PW REG") 852 using a write password command ("Wr PW Cmd") 854 and data bus 804. When the contents of first password register ("PW REG") 858 and second password register ("PW REG") 852 match, logic gate 865 generates a password compared ("PW Comp") 890 signal, which is logically ANDed with write enable signal 808 for altering data in permissions override list repository 822. Thereafter, the authorized user can alter the password and the data in permissions override list repository 822. Users that enter passwords that cause password compared 890 signal to fail (i.e., password values do not match) will disable write access to permissions override list repository 822.

In another embodiment, access override controller 850 can include a Master Lockout Bit register ("r") 874 configured to generate a master lock bit 877. Once bit 877 is set in configuration memory 872, no future writes to configuration memory 872 will be allowed. This feature allows the chip to be set in a mode where no hacker can come in and alter settings once the memory is initialized. As such, bits constituting the password will not be able to be altered.

In one embodiment, an authorize user can access inputs 862 to initialization state machine 870 to set password protection features, such as how many bytes long a password can be. As another example, inputs 862 can configure initialization state machine 870 to implement a sequence of access steps, that if an unauthorized does not know, will bolster security. As such, unauthorized users attempting to repeatedly try new passwords will not know the proper sequence, so that even if they try many password combinations, they will be hindered in their search for the right password.

Figure 9:
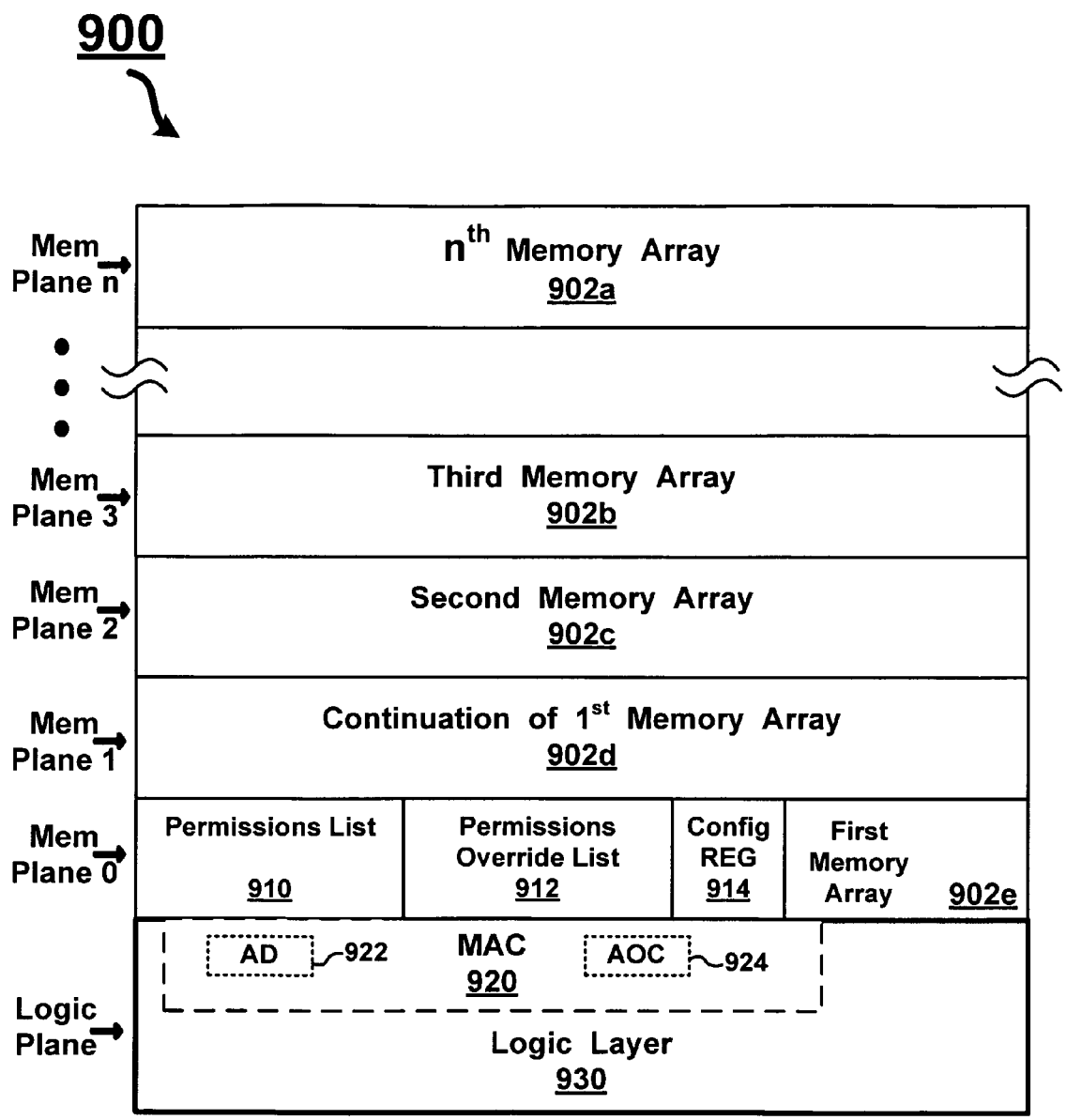
FIG. 9 depicts a cross-section view of an example of an integrated circuit implementing a memory access circuit, according to one embodiment of the invention.

FIG. 9 depicts a cross-sectional view of an example of an integrated circuit 900 implementing a memory access circuit, according to one embodiment of the invention. Cross-sectional view 900 depicts multiple memory layers being vertically disposed above or on a logic layer 930, which can include logic circuitry for implementing selection of memory cells as well as controlling access to those memory cells, and a semiconductor substrate upon which the logic circuitry can be formed. The logic circuitry, for example, can include a memory access circuit ("MAC") 920 having an access detector circuit ("AD") 922 and an access override controller circuit ("AOC") 924. Multiple memory layers can include a first layer 902e having a first group 910, a second group 912 and a third group 914 of third dimension memory cells operable as a permissions list, a permissions override list, and a configuration register ("Config REG"), respectively. Note that first group 910, second group 912, and third group 914 of third dimension memory cells can be placed in other memory planes or sub-planes, and therefore, need not be restricted to layer 902e. First layer 902e also contains a portion of a first memory array, which continues into second layer 902d of third dimension memory cells. A third layer 902c, a fourth layer 902b and an Nth layer 902a include third dimension memory cells for a second array, a third array, and an Nth array, respectively. In other embodiments, the multiple memory layers shown in cross-sectional view 900 can include more or fewer layers than as shown in FIG. 9, any of which can emulate other types of memory technologies (e.g., DRAM, SRAM, ROM, EEPROM, and Flash). Note that in this example each of the multiple memory layers is oriented in the X and Y plane, each plane being designated by "Mem Plane." Logic layer 930 is shown to lie in a base plane designated as "logic plane." The logic plane can be formed (e.g., fabricated) in a silicon (Si) substrate, such as a silicon wafer, for example. The vertically stacked memory planes 0 through n can be fabricated on top of the logic plane and vias or the like can be used to electrically couple circuitry in the logic plane with the multiple memory layers in memory planes 0 through n.

The invention can be implemented in numerous ways, including as a system, a process, an apparatus, or a series of program instructions on a computer readable medium such as a computer readable storage medium or a computer network where the program instructions are sent over optical or electronic communication links. In general, the steps of disclosed processes may be performed in an arbitrary order, unless otherwise provided in the claims.

The foregoing description, for purposes of explanation, used specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment can readily be interchanged with other embodiments.

Thus, the foregoing descriptions of specific embodiments of the invention are presented for purposes of illustration and description. They are not intended to be exhaustive or to limit the invention to the precise forms disclosed; many alternatives, modifications, equivalents, and variations are possible in view of the above teachings. For the purpose of clarity, technical material that is known in the technical fields related to the embodiments has not been described in detail to avoid unnecessarily obscuring the description. Thus, the various embodiments can be modified within the scope and equivalents of the appended claims. Further, the embodiments were chosen and described in order to best explain the principles of the invention and its practical applications; they thereby enable others skilled in the art to best utilize the invention and various embodiments with various modifications as are suited to the particular use contemplated. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

What is claimed is:

1. An integrated circuit, comprising:
    a substrate including circuitry fabricated in a logic layer of the substrate;
    a memory in contact with and fabricated directly above the substrate, the memory including a plurality of vertically stacked memory layers that are in contact with one another, each memory layer is positioned in a memory plane that is distinct from memory planes of other memory layers, and each memory layer including at least one non-volatile two-terminal cross-point memory array that is electrically coupled with the circuitry, at least a portion of the circuitry is configured to perform data operations on the at least one non-volatile two-terminal cross-point memory array, each non-volatile two-terminal cross-point memory array including a plurality of two-terminal memory cells; and
    a memory access circuit included in the circuitry and configured to enable or disable data operations access to a first subset of the plurality of two-terminal memory cells in response to a plurality of signals electrically coupled with the memory access circuit, the plurality of signals including access control data and a controllable access address, the access control data is stored in an access control memory having one or more access control memory cells included in a second subset of the plurality of two-terminal memory cells.

2. The circuit of claim 1, wherein at least one two-terminal memory cell in the first subset of the plurality of two-terminal memory cells resides in a different memory plane in the memory than another two-terminal memory cell in the access control memory.

3. The circuit of claim 1, wherein the plurality of two-terminal memory cells comprise third dimension memory cells.

4. The circuit of claim 1, wherein the memory access circuit is further configured to communicate with any of the plurality of vertically stacked memory layers of the memory to determine the access control data for the first subset of the plurality of two-terminal memory cells.

5. The circuit of claim 1, wherein the memory access circuit comprises a circuit portion and a memory portion, the circuit portion is positioned in the logic layer and the memory portion is positioned in one or more of the plurality of vertically stacked memory layers.

6. The circuit of claim 1, wherein the plurality of vertically stacked memory layers are configurable to include an amount of the second subset of the plurality of two-terminal memory cells, the amount being distributed in a vertical arrangement.

7. The circuit of claim 6, wherein the vertical arrangement comprises a variable amount of the second subset of the plurality of two-terminal memory cells without substantially increasing a size of the substrate.

8. The circuit of claim 1, wherein the memory access circuit is further configured to detect the data operations access to the first subset of the plurality of two-terminal memory cells and to restrict the data operations access to the first subset of the plurality of two-terminal memory cells substantially in parallel with the data operations access.

9. The circuit of claim 1, wherein the data operations access includes either a write operation or read operation, or both, in association with the first subset of the plurality of two-terminal memory cells.

10. The circuit of claim 1, wherein the plurality of vertically stacked memory layers are formed directly on top of the logic layer using a fabrication process that was used to form the circuitry in logic layer.

11. The circuit of claim 1 and further comprising:
    an access interrupter included in the circuitry and configured to interrupt application of an access voltage to the first subset of the plurality of two-terminal memory cells, wherein interrupting the application of the access voltage is operative to disable the data operations access.

12. The circuit of claim 11, wherein the access interrupter is further configured to interrupt application of a write access voltage to the first subset of the plurality of two-terminal memory cells, if the data operations access is a write operation, and to interrupt application of a read access voltage to the first subset of the plurality of two-terminal memory cells, if the data operations access is a read operation.

13. The circuit of claim 1 and further comprising:
an override access controller included in the circuitry and configured to neutralize the access control data.

14. The circuit of claim 1, wherein the first subset of the plurality of two-terminal memory cells constitute a row.

15. The circuit of claim 14, wherein the row comprises a sector.

16. The circuit of claim 1, wherein the first subset of the plurality of two-terminal memory cells constitute a portion of a row.

17. The circuit of claim 16, wherein the portion comprises a byte.

18. The circuit of claim 1, wherein the first subset of the plurality of two-terminal memory cells constitute a block of memory.

19. The circuit of claim 1, wherein the second subset of the plurality of two-terminal memory cells comprises a write protect bit configurable to permit or prohibit write data access to the first subset of the plurality of two-terminal memory cells.

20. The circuit of claim 1, wherein the second subset of the plurality of two-terminal memory cells comprises a read protect bit configurable to permit or prohibit read data access from the first subset of the plurality of two-terminal memory cells.

21. The circuit of claim 1, wherein the plurality of vertically stacked memory layers further comprise a vertically-stacked arrangement of third dimension memory cells.

22. The circuit of claim 1, wherein each two-terminal memory cell includes a two-terminal memory element that changes conductivity as a function of a voltage differential between a first terminal and a second terminal.

23. The circuit of claim 1, wherein the plurality of vertically stacked memory layers include a plurality of two-terminal memory elements, each two-terminal memory element including an electrolytic tunnel barrier and a mixed valence conductive oxide that are in contact with each other and electrically in series with each other.

24. The circuit of claim 1, wherein the memory comprises a third dimension memory array including a two-terminal stacked cross-point array.

25. The circuit of claim 24, where the two-terminal stacked cross-point array includes a plurality of two-terminal memory elements.

* * * * *